US005469051A

United States Patent [19]

Yarmchuk

[11] Patent Number: 5,469,051
[45] Date of Patent: Nov. 21, 1995

[54] ELECTRICAL DEFECT DETECTOR FOR CIRCUIT LINES

[75] Inventor: Edward J. Yarmchuk, Mahopac, N.Y.

[73] Assignee: International Business Machines Corp., Armonk, N.Y.

[21] Appl. No.: 235,776

[22] Filed: Apr. 29, 1994

[51] Int. Cl.$^{6}$ .................... G01R 19/25
[52] U.S. Cl. .................... 324/158.1; 324/607; 324/622
[58] Field of Search .................... 324/158.1, 73.1, 324/520, 521, 622, 607, 626, 605; 371/15.1, 25.1, 1.1; 364/481, 550

[56] References Cited

U.S. PATENT DOCUMENTS 3,299,351 1/1967 Williams .................... 324/52
3,500,188 3/1970 Whitley .................... 324/64
3,991,363 11/1976 Lathrop .................... 324/52
4,039,938 8/1977 Link .................... 324/52
4,496,900 1/1985 DiStefano et al. .................... 324/51
4,837,502 6/1989 Ugenti .................... 324/73
4,868,506 9/1989 DiStefano et al. .................... 324/521
4,871,971 10/1989 Jeerings et al. .................... 324/509
5,044,766 9/1991 Stuart .................... 374/43

OTHER PUBLICATIONS

Journal Appl. Phys. 49 (2), Feb. 1978 pp. 717–722 entitled. "Pulse nonlinearity measurements on thin conducting films" by A. T. English, G. L. Miller, D. A. H. Robinson, L. V. Dodd and T. Chynoweth IEEE Transactions On Instrumentation and Measurement vol. IM–34 No. 4.
Dec. 1985, pp. 590–593 entitled "Application of Nonlinearity Measuring Method Using Two Frequencies to Electrical Components by Makoto Kanno and Isao Minowa".

*Primary Examiner*—Vinh P. Nguyen
*Attorney, Agent, or Firm*—Perman & Green

[57] ABSTRACT

A device which detects conductors, the device has a portion which applies a current to a conductor consisting of a first frequency signal and a second frequency signal. The frequency of the second frequency signal is double the frequency of the first frequency signal. The device has another portion which detects a DC voltage across the conductor. An adjusting portion adjusts a phase of the first frequency signal relative to a phase of the second frequency signal to produce a zero detected DC voltage across a representative length of conductor known to be free of defects.

11 Claims, 5 Drawing Sheets

ELECTRICAL DEFECT DETECTOR FOR CIRCUIT LINES

FIELD OF THE INVENTION

The present invention relates to a device capable of detecting defects in conductors, and more particularly to a defect detector which considers a phase response of a thermal response of a conductor when a current is applied through the conductor.

BACKGROUND OF THE INVENTION

The reliability of electronic systems can suffer due to the presence of latent open defects in the circuit boards or ceramic modules of electronic packages. Such defects consist of a local reduction in cross sections which may result from breakages, narrow conductors, intermittent opens, etc. in the cross sectional area of the conducting lines of the package. The reduced cross section leads to an increased possibility that an open circuit will develop as a result of applied stresses from processing, assembly, or use. Typically, the excess resistance of such a defect cannot be detected directly because it is much smaller than the resistance differences arising from normal process variations.

Two test systems which are capable of detecting latent open defects are in use today. These are Electric Board Tester (hereafter referred to as "EBT") which is used for detecting defects on epoxy-glass circuit boards, and the Electric Module Tester (hereafter referred to as "EMT"), which is used to test the interconnection circuitry on multilayer ceramic modules. One EBT is illustrated in U.S. Pat. No. 4,496,900 entitled "Nonlinearity Detection Using Fault-Generated Second Harmonic" issued Jan. 29, 1985 to DiStefano et al. (incorporated herein by reference). One EMT is illustrated in U.S. Pat. No. 4,868,506 entitled "Defect Detection Using Intermodulation Signals" issued Sep. 19, 1989 to DiStefano et al. (incorporated herein by reference). Both of the above EMT and EBT patents are assigned to the assignee of the present invention, and involve the detection of nonlinear electrical effects arising from the resistance modulation produced by local heating at the defect site. The present invention relies on a similar physical mechanism, but uses a different type of excitation and detection technique as described below. The following describes each version in more detail, and points out distinctions between the present invention and both existing testers.

In the EBT system the magnitude of the drive current that is passed through the circuit line under test is given by:

$$I = I_{DC} + I_1 \sin(\omega t). \qquad (1)$$

The nonlinear electrical effect at a defect results in the generation of harmonics of the drive frequency, and the EBT operates by measuring the amplitude and phase of the second harmonic voltage appearing across the circuit line. The first harmonic is related to the characteristics of the conductor itself, but certain of the higher order harmonics result from the defect and are capable of providing significant information about the characteristics of the defect. More specifically, a power, $P = I^2 R_d$, is dissipated at a local defect having resistance $R_d$. A local temperature has an AC response to this heat input which is given by:

$$\Delta T = 2\beta(\omega) I_{DC} I_1 R_d \sin[\omega t + \theta(\omega)] - \qquad (2)$$

-continued $$\beta(2\omega)\frac{I_1^2}{2} R_d \cos[2\omega t + \theta(2\omega)],$$

where $\beta(\omega)$ and $\theta(\omega)$ represent the magnitudes and phases, respectively, of the thermal response to the electric drive currents cycling at the frequency $\omega$. These terms depend upon the details of the local thermal environment of the conductor, which may be analyzed to provide considerable useful information about the defect. A similar effect occurs in a distributed fashion along a length of circuit lines with a lack of defects (referred to herein as "good-lines"), which gives rise to an overall temperature modulation having the same form as equation 2. The thermal environment for a long section of good-line differs dramatically from that of a localized defect, so the magnitudes and (more importantly for the present application) the phases of their response are quite different. By detecting voltages at a precise phase, chosen to be orthogonal to the phase of the good-line signal, the EBT achieves excellent selectivity for defect signals even for very long circuit lines. Any portion of the signal which is parallel to the good-line signal is considered as relating only to the good-line signal; while any portion of the signal which is orthogonal to the good-line signal relates only to the defect signal.

The temperature modulation gives rise to resistance changes equal to $z\alpha R\Delta T$, where $\alpha$ is the temperature coefficient of resistivity. The nonlinear voltage signal across the circuit line, $V_d$, equals the drive current times this resistance. The second harmonic term is given by:

$$V_{2f} = \frac{-\alpha I_{DC} I_1^2 R_d^2}{2}\{2\beta(\omega)\cos[2\omega t + 2\theta(\omega)] + \beta(2\omega)\cos[2\omega t + \theta(2\omega)]\}. \qquad (3)$$

It turns out that for defects of interest this signal has an amplitude as small as a fraction of a microvolt. This defect signal must be detected in the presence of a fundamental signal of the conductor which has an amplitude which is nearly seven orders of magnitude larger than the defect signal. To achieve this defect signal recognition, a passive filter is used to reduce the magnitude of the fundamental signal prior to a preamplifier, and the amplifier itself must provide extremely low levels of harmonic distortion. These requirements lead to further associated expenses. Furthermore, the current source must have extraordinarily small levels of harmonic content (1 in $10^7$). This limits the drive current to about 0.6 amps, and the frequency to about 1 KHz.

Several tuned circuits are needed in EBTs, and the system is thereby limited to only a single frequency of operation. The EBT works well for circuit lines on epoxy-glass boards, and more generally for testing defects in conductors when the conductors have relatively large cross section. For very thin conductors the size of the good-line signal becomes so large that the use of phase selectivity is insufficient to allow discrimination resulting from the defect signal compared to normal variations in good-line signals. In such cases, the EBT system may have limited output response characteristics. The amplitude of the good-line signals drops off inversely with frequency while the defect signals tend to have a constant amplitude versus frequency so it is very advantageous to work at higher frequencies.

The EMT system improves the testability of conductors having a relatively thin cross-section by using a much higher operating frequency. Since harmonic distortion in amplifiers increases rapidly with frequency, a different scheme than simple frequency doubling was employed in EMTs. In this system two separate frequencies are used in addition to DC, and the signal of interest which is used to detect defects occurs at the difference frequency. The drive current is given by:

$$I=I_{DC}+I_1 \sin(\omega_1 t)+I_2 \sin(\omega_2 t). \quad (4)$$

Power is dissipated as the square of the current, giving rise to resistance modulation at frequencies $\omega_1$, $\omega_2$, $2\omega_1$, $2\omega_2$, $\omega_2-\omega_1$, and $\omega_2+\omega_1$. Multiplying by the current to get the voltage and keeping only the difference frequency terms yields:

$$V_{2-1} = \alpha I_{DC} I_1 I_2 R_d{}^2\{\beta(\omega_1)\cos[(\omega_2-\omega_1)t-\theta(\omega_1)] + \beta(\omega_2)\cos[(\omega_2-\omega_1)t+\theta(\omega_2)] + \beta(\omega_2-\omega_1)\cos[(\omega_2-\omega_1)t+\theta(\omega_2-\omega_1)]\}. \quad (5)$$

The four terms relate to temperature modulation at $\omega_1$, $\omega_2$, and $\omega_2-\omega_1$, and contain their respective amplitude factors and phases. The ability to distinguish signals from conductor with defects from good-line signals (which are considered as those signals produced by the conductor itself in the absence of any defects) by means of the phase is accomplished in the same manner as in the EBT. The two frequencies are generated by separate circuits and summed using passive components to minimize intermodulation distortion that would introduce additional $\omega_2-\omega_1$ component in the drive current. Tuned circuits are required in the drive circuits to further reduce the coupling between the two oscillators. The detector circuit also contains tuned filters to reject the relatively enormous signals present at the fundamental frequencies. The frequencies are approximately 1.5 MHz and 1.0 MHz, giving rise to a difference frequency signal of about 0.5 MHz. These frequencies are very well suited to detecting defects in circuit lines and such lines as those typically found in ceramic modules. The drive currents are limited to about 0.5 amps and the system operates with fixed drive frequencies.

A drawback of operating at very high frequencies in EMTs is that only defects having a relatively short length within a conductor provide the best defect testing characteristics. The maximum detectable defect length and operating frequency are related because of the phase selectivity that is used to allow detection of defects in the presence of large good-line signals. For a very short defect, the surrounding sections of good-line act as a thermal reservoir connected to the defect region by a low thermal impedance (the connection is via metal which has a low thermal resistance). The temperature of the localized defective region therefore tracks the applied AC power virtually directly and instantaneously, with very little phase shift. The magnitude of the temperature swing is independent of frequency in conductors with short defects. A long section of good-line, however, has a much higher heat capacity than a small defect and is only weakly coupled to its surroundings. Thus with long sections of good-lines, the temperature loosely tracks the time integral of the AC power resulting in a phase shift of approximately 90 degrees. Also, the magnitude of the temperature swing is inversely proportional to frequency because of the integration effect. For defects of finite length, the thermal response varies between these two limiting behaviors, depending on the operating frequency. Roughly speaking, the heat capacity of a defective region times the thermal impedance between it and the nearest thermal reservoir yields a thermal response time. If the frequency of the AC power dissipation is relatively high, then the defect response signal may be indistinguishable from the good-line signal.

It should be noted that the phase of the thermal response of actual circuit lines is not exactly equal to 90 degrees, even if there are no defects present. Details of the line width, thickness, composition, and environment make real systems more complicated than the simple model described above. Phase shifts of as much as 35 degrees from the ideal model of 90 degrees have been observed. This is why the ability to finely adjust the detection phase is important in defect detection applications. Each product type, and even different line types within a given product, may have a characteristic phase for good-lines. To achieve a sufficient detectability between defect signal and good-line signals, it is necessary to adjust and maintain the detection phase within 0.6 degrees of orthogonality from the good-line phase. This becomes evident when one realizes that the output for the good-line signals are sometimes 100 times as large as the defect signals.

The optimum frequency of operation depends on a trade-off between the desire to minimize the size of the good-line signal by going to high frequencies (in EMT) against the need to detect defects that may be relatively long by operating at low frequencies (in EBT). Thus, the ability to operate over a wide range of frequencies with one instrument would offer a significant advantage in flexibility. Furthermore, combining a series of measurements made at various frequencies allows one to determine the frequency at which the behavior of the defect crosses over between the two limits, thereby providing additional information concerning the length of a defect. This can be valuable in screening tests since a given defect signal could arise either from a short, severe constriction or a long, slight one, with the latter typically being much less of a reliability risk during operation of the circuit.

The sensitivity of the EBT and EMT scales as the cube of the drive current, so even modest increases in current can yield substantial gains in sensitivity. The present levels of sensitivity are thought to be sufficient to meet the reliability needs of existing products, so lowering the threshold of detection by increasing sensitivity is not required. However, the speed at which a test can be performed can be increased if the signal levels are raised. For example, an increase of a factor of two in drive currents would yield an increase by a multiple of eight in signal, which could be traded off for an increase in detector bandwidth of a factor of 64. The EBT system requires several tenths of a second to perform a measurement, and reducing this time could substantially improve overall throughput in a typical robotic probing system. The EMT runs about ten times faster than the EBT so it has less impact on total probe time, but faster performance would greatly impact the test time for relay switched, bed-of-nails testing. The present invention circumvents the key limiting factors of both the EBT and EMT, allowing the use of higher operating currents and a wide range of frequencies in a single system.

Another defect detector is illustrated in U.S. Pat. No. 3,500,188, entitled "Method and Means For Measuring Constriction Resistance Based on Nonlinearity" issued Mar. 10, 1970 to Whitley (incorporated herein by reference). This U.S. Patent illustrates the use of currents of two frequencies 1f and 2f, and observing a DC voltage produced thereby. Whitley described the use of a detection frequency which is far from either of the excitation frequencies. This detection frequency can be used to detect the characteristics, and presence, of a constriction resistance. Whitley's system is non-destructive. In Whitley's system, there is no phase selectivity described. There is no description of any connection between the two driving frequency signals 1f and 2f and the thermal response, which is one very desirable feature of the present invention. Only a relatively crude defect detection may be performed without these features.

Another system is capable of both detecting and locating latent defects exists. This system is limited to use on exposed levels of circuitry, and operates by utilizing eddy currents. This system operates in a non-destructive manner.

SUMMARY OF THE INVENTION

The present invention relates to a device which detects conductors which have defects and includes a portion which applies a current to a conductor consisting of a first frequency signal and a second frequency signal. The frequency of the second frequency signal is double the frequency of the first frequency signal. The device has another portion which detects a DC voltage across the conductor. An adjusting portion adjusts a phase of the first frequency signal relative to a phase of the second frequency signal to produce a zero detected DC voltage across a representative length of conductor known to be free of defects. In an alternate embodiment of the present invention, the first frequency signal and the second frequency signal differ from each other by a relatively small difference amount. The difference amount relates to a generation of a low frequency AC signal.

DETAILED DESCRIPTION OF THE PRESENT INVENTION

One major feature which distinguishes the present invention from the prior art EMTs and EBTs described above is that defects in conductors can be sensed by utilizing a particular form of drive current (i.e. no DC component in the drive current as illustrated by equation (6)) which allows detection of the signal of interest at zero frequency. Additionally, the drive current has two frequencies, one being double the other, with a phase shift $\phi$ being incorporated to permit a proper thermal phase selectivity for an output signal of interest. The drive current is:

$$I=I_1 \sin(\omega t)+I_2 \sin(2\omega t+\phi), \tag{6}$$

where $\omega=2\pi f$ and f is the fundamental frequency.

In both the EMT and the EBT, the output detection signal of interest is AC and the phase selectivity is achieved through phase sensitive detection of this AC signal. A feature of the present invention is that the use of phase selectivity takes place in the drive signals. With the output signal of interest being DC in the first embodiment of the present invention, phase selectivity in the detection circuitry alone is impossible. The Whitley patent, which uses a similar input drive current to equation (6), does not illustrate any technique for adjusting the relative current phase in a manner which permits thermal phase selectivity. The adjustment of relative current phases for thermal phase selectivity, in the manner of the present disclosure, is especially useful for defect detection in the presence of large good-line signals.

Component Layouts

Figure 1A:
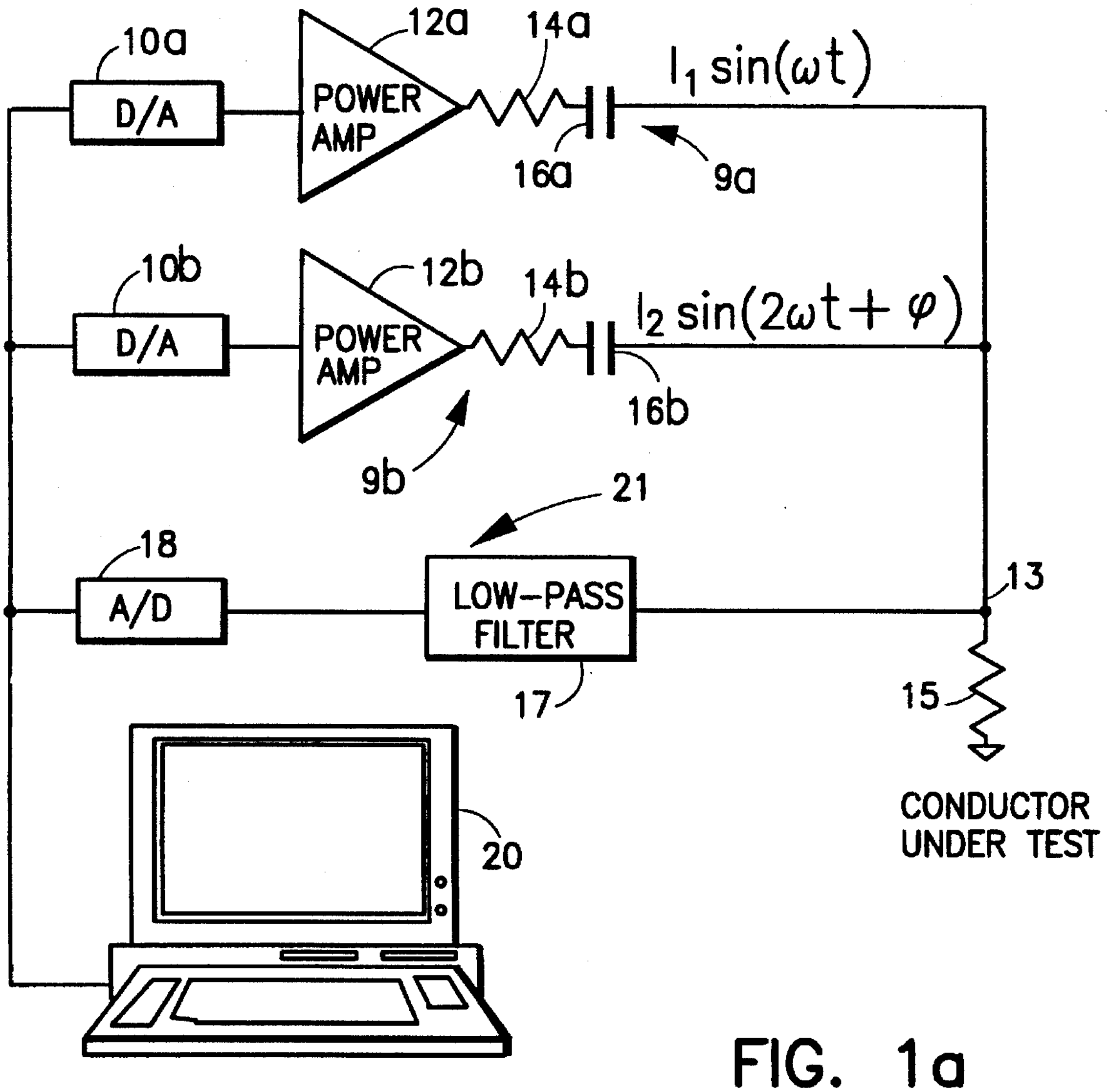
FIG. 1*a* illustrates a schematic illustration of the elements included in one embodiment of the defect detector of the present invention.

FIG. 1*a* shows a component layout of one embodiment of this invention. In FIG. 1*a*, two current terms (a first frequency signal 1f and a second frequency signal 2f) are digitally generated, within two respective current paths 9*a*, 9*b* from computed waveforms within a digital computer 20 using digital to analog converters (hereafter referred to as "D/A") 10*a*, 10*b*. The generated drive signals are of the form illustrated in equation (6). The signals are then amplified using the two respective channels of a stereo audio amplifier 12*a*, 12*b* for each current path 9*a*, 9*b*. The two channels are configured as constant current sources (approximately) by including series resistors 14*a*, 14*b* that are large compared to the resistance of the circuit line or conductor 15 under test. Also, both current paths have a blocking capacitor 16*a*, 16*b* which blocks all DC currents applied to the conductor. After the capacitors 16*a*, 16*b*, all of the current paths 9*a*, 9*b* merge at a junction node 13. The junction point is in contact with one end of the conductor 15, with the other end of the conductor grounded.

A novel aspect of this invention is that the nonlinearity of the circuit line is used to perform the phase sensitive detection, resulting in the generation of a DC voltage in the absence of any DC current. In the EBT and EMT, an AC reference signal is required to perform the phase sensitive detection of the incoming signal; the phase is adjusted to give zero sensitivity to the nonlinear signal from good-lines. In the present defect detector, the phase term $\phi$, plays exactly the same role.

In the present invention, the frequency of interest which depends on the desired response time for the measurement differs from the drive frequency by many orders of magnitude; allowing very effective blocking of undesired components of the drive current using simple passive elements such as capacitors. Much higher drive current levels can be used effectively because higher levels of distortion in the drive amplifiers (which result in these unwanted components) can be tolerated.

The great disparity between the drive frequencies and the signal frequency has a profound impact on the signal detection circuitry as well. For example, a simple passive network consisting of a cascade of 3 RC filters each with a 5 millisecond time constant provides an attenuation of about 150 dB for a 10 KHz drive signal (168 dB for the 20 KHz component.) Nonlinear generation in the detector amplifier is not of concern with this technique. The present invention allows for a wide range of drive frequencies, enabling the best above described features of both the EBT and EMT to be combined into a single instrument, as well as providing a high degree of tunability.

As also shown in FIG. 1*a*, after recovery of the signal of interest via electrical path 21, which includes a low pass filter 17, the recovered signal is read into a computer 20 via an analog to digital converter 18 (hereafter referred to as "A/D"). The input of the low pass filter 17 is coupled to each of the two paths 9*a*, 9*b* at the junction node 13. One mode of operation involves applying short bursts or pulses of current under the control of the computer 20 to the conductor. A burst is defined as a plurality of periodic cycles of AC current consisting of a first frequency signal 1f and a second frequency signal 2f having a fixed relative phase $\phi$, the phase of each burst typically differs from the other bursts. Often each burst lasts for a duration which incorporates hundreds of cycles of the input AC signals. The A/D 18 is read just prior to the burst, and again during the burst (each reading from an A/D converter may involve a series of measurements that are averaged to provide the reading) to limit drift. The difference between the readings provides a measure of the signal of interest without undue 1/f noise contributions. A number of other signal processing options can be incorporated as well. A particularly useful processing option involves using two successive bursts which are produced by the D/A converters 10*a* and 10*b*, in which the phase $\phi$ differs by 180 degrees. This causes the signal of interest to come out inverted. Subtracting readings taken during the two bursts results in cancellation of amplifier offset together with a doubling of the signal.

Figure 7:
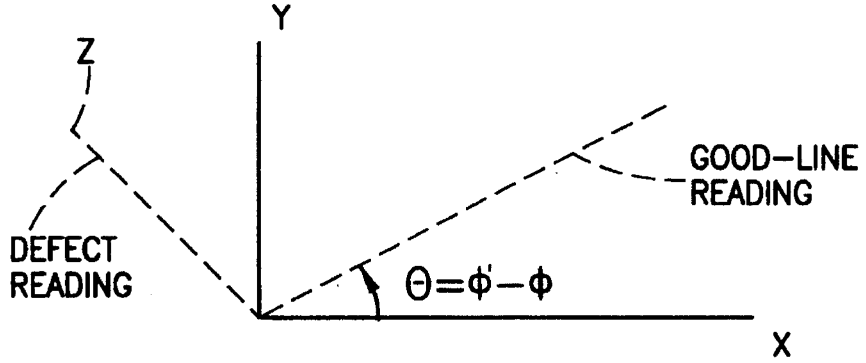
FIG. 7 illustrates a geometric outline which describes how a defect reading "Z" is calculated.

In the event that the phase has not been selected, an arbitrary phase value may be used to generate a reading X (see FIG. 7.) Another orthogonal reading Y is obtained from another set of bursts with an offset of 90 degrees from that used to obtain X. The readings X and Y, however, are each contributed to partially by a good-line portion and a defect portion. Since the defect component is defined as being orthogonal to the good-line component, the defect components Z may be obtained by rotating the coordinate system involving the readings X and Y, by an angle $\Theta$ which makes the reading Z insignificantly small when exposed to a good-line. The reading Z is especially significant since it will have a relatively large magnitude in a conductor with a defect. Therefore, if there is a significant component Z (the specific amount which comprise small values compared to significant value may be determined empirically), then there is an indication that the conductor has a defect. The algebraic equation, which may be input into associated computer software, and which may be used to determine the reading Z is:

$$Z=Y\sin(\theta)-X\cos(\theta) \quad (7)$$

Equation (7) provides essentially continuous phase adjustment without having to recompute the drive current waveforms.

The use of the computer 20 to precisely control the detection of phase permits the use of tabulated values (resulting from the test of good-line phases) in an automated test sequence. The table generated by testing known good-lines provide the reference phase values. Any slight variations in phase for the different lengths and widths of each circuit line are compensated for. The compensation results from empirical tests of known good-lines. The good-lines yield a specific phase, so identical good-lines conductors should yield identical phase information. This compensation process results in improved detection selectivity. It is also possible to use data taken at several different frequencies to obtain an additional measure of selectivity than that provided by phase alone. This would be based on the fact that the good-line signal and the defect signal have different characteristic frequency dependencies.

The frequency at which the defect signal begins to drop off is indicative of the length of the defective region (this affects the thermal response time). There are two factors which make longer defects appear as good-lines. The first factor is the heat capacity of the conductor. The second factor is the thermal impedance of the conductor. These factors follow equation (8):

$$\text{Heat Capacity}\times\text{Thermal Impedance}=\text{Thermal Response Time} \quad (8)$$

The scheme of operation in which the drive signals are synthesized by the computer 20 can be extended up to frequencies of 10 MHz or so through the use of commercially available arbitrary waveform generators together with RF power amplifiers. The signal detection is unaffected by the drive frequency. Computer generation of the drive signals is convenient and accurate but is not required. A phase-locked-loop could be used to generate the $2\omega$ signal at a precise phase relative to the $\omega$ signal. Any suitable technique to generate these waveforms is within the scope of the present invention. Modulation of the phase to allow for amplifier offset cancellation may be readily incorporated.

An extension of this concept involves a constant rate of change of phase, which results in a sinusoidal signal with a period equal to the time required for the phase to change by 360 degrees. This corresponds to a case in which the drive frequencies are not exactly a factor of 2 apart. The difference between twice the first frequency and the second frequency is called a difference frequency. The difference frequency has a frequency which is much lower than either the first frequency or the second frequency.

A reference signal at the difference frequency may be generated by using non-linear circuit elements such as mixers. A first mixer is used to produce an output signal at the second frequency, and the second mixer is used to produce a second output signal at a difference frequency. The difference frequency is defined as the difference in frequency between the second frequency signal and twice the first frequency signal. The second mixer output is phase shifted using phase shifting circuitry (well known in the DSP area) to provide a reference signal for performing phase sensitive detection of the voltage applied across the conductor. Thermal phase selectivity can be accomplished through variation of the phase shift applied to the reference signal in a manner similar to that employed (and previously described) with reference to the EMT and EBT. This configuration represents an alternative embodiment of the present invention. This is still a fundamentally different approach from either the EMT or EBT since no DC current is applied to the drive signal in the present invention embodiment. The substantial advantages of higher drive current capability and tunability between the drive and detection frequencies are still present in the present embodiment.

Figure 1B:
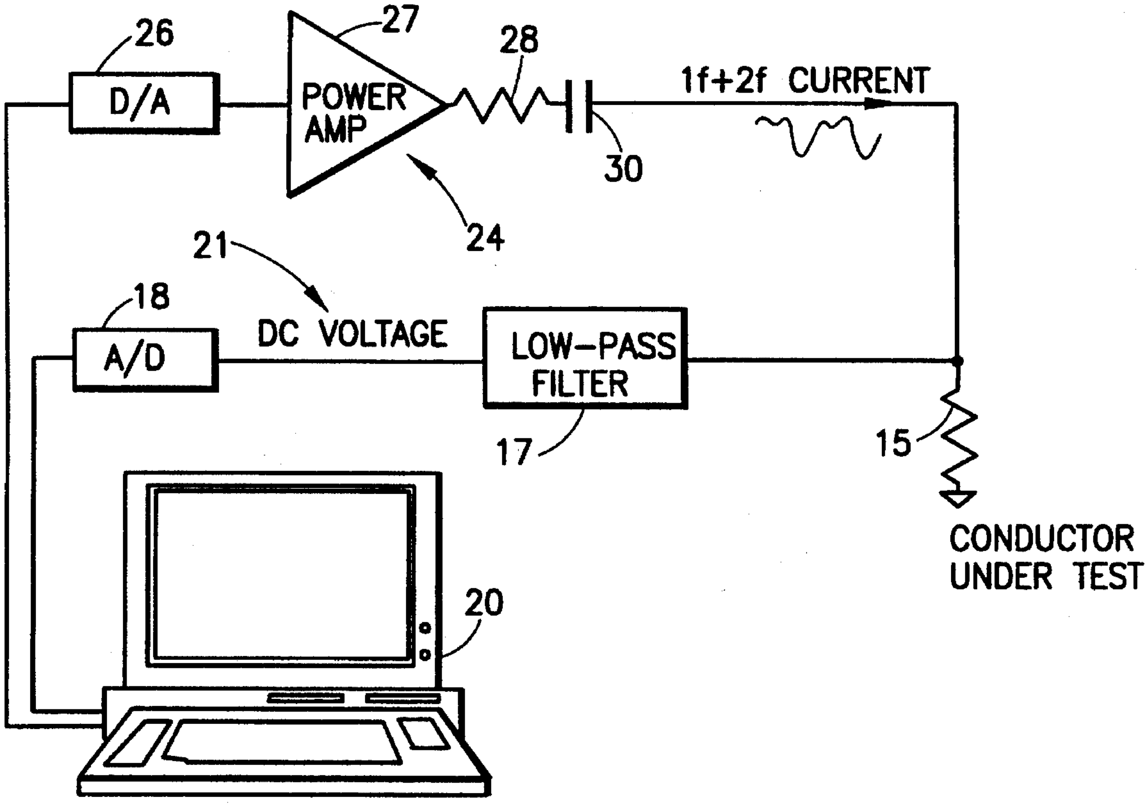
FIG. 1*b* illustrates a schematic illustration of the elements included in another embodiment of the defect detector of the present invention.

FIG. 1*b* illustrates an alternate embodiment of the present invention wherein the current paths 9*a* and 9*b* are replaced by a single current path 24. The current path 24 has a D/A converter 26, a power amplifier 27, a resistor 28, and a capacitor 30. The operation of the single current path 24 (which has exactly the same elements as the multiple current paths 9*a* and 9*b*) functions in exactly the same manner as the multiple current paths 9*a* and 9*b*, except that the D/A converter 26 superimposes the two components of the first frequency signal f1 and the second frequency signal f2 which are generated from the computer 20 within one current path 24.

In the remainder of the disclosure, all reference will be made with reference to the FIG. 1*a* embodiment, with the understanding that in the FIG. 1*b* configuration could be utilized instead.

Figure 6:
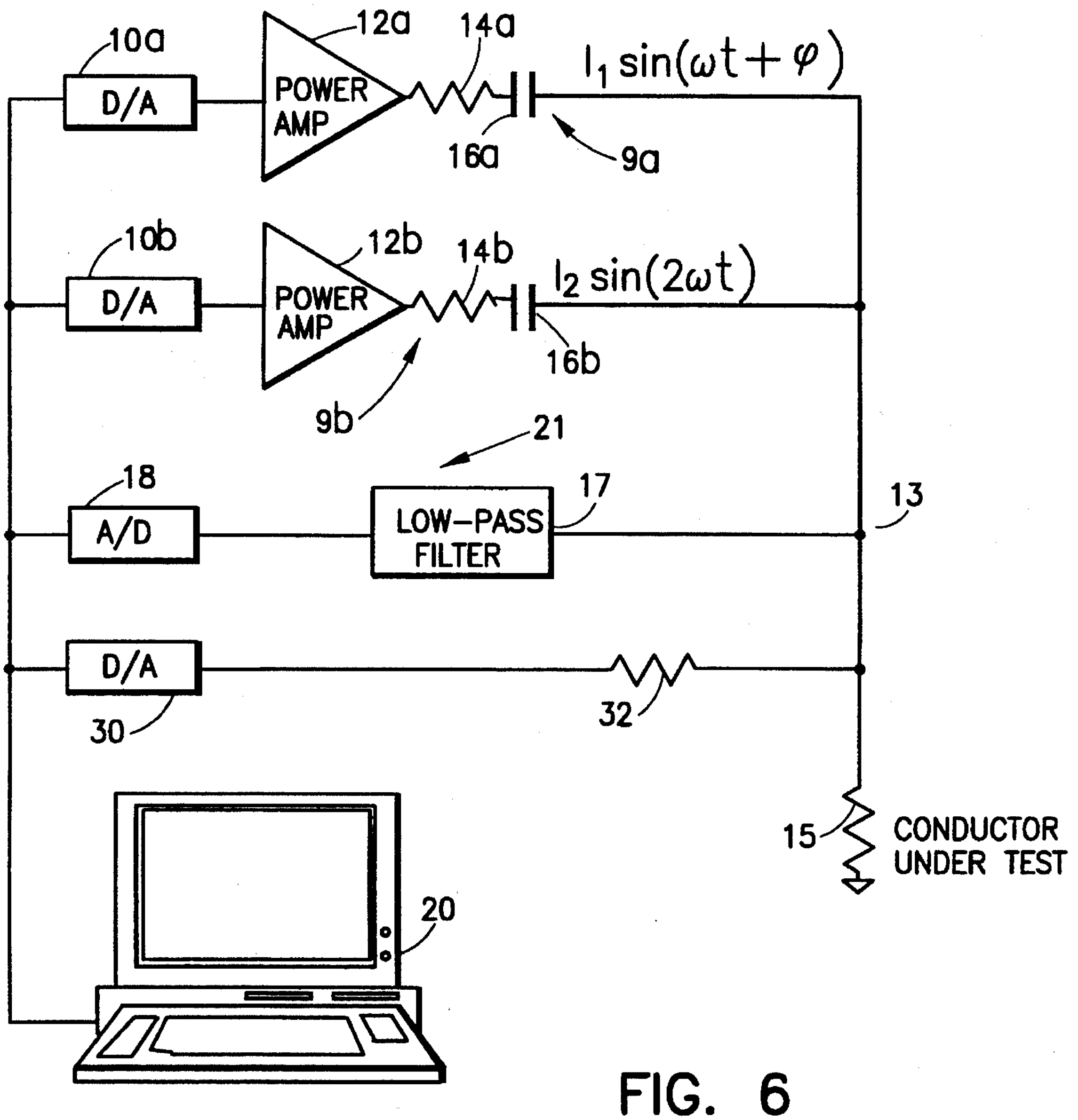
FIG. 6 illustrates a schematic illustration of the elements included in another embodiment of the defect detector of the present invention, which is similar to the FIG. 1*a* configuration, but involves a contact sensor/resistance measurement circuit.

A very useful additional feature that is illustrated in FIG. 6 is a contact sensor/resistance measurement circuit. A small amount of DC current would be provided by connecting a DC voltage source (preferably utilizing another D/A converter 30) through a large series resistor 32 (1 MegOhm for example) to the circuit line under test. When good electrical contact is established, the voltage at the A/D will drop to a low level. This serves to indicate the presence of good contact and allows the value of the device resistance to be measured (it's proportional to the measured voltage). The value of the resistance would be used to compute, and correct for, the relative phase shift between the two drive frequencies that arises from the presence of the blocking capacitors 16*a*, 16*b*. The drive amplitudes could also be compensated to maintain a constant sensitivity level. Prior to applying the AC current bursts the DC supply would be switched off.

Waveform Synthesis

One distinguishing feature of the present invention arises from the particular form of the drive current and the choice of the signal of interest. In both the FIGS. 1*a* and 1*b* embodiments, a current waveform having a fundamental frequency plus a second harmonic is applied to the circuit line under test as illustrated in equation 6. The power dissipated in the circuit line is proportional to the square of the current and contains modulation terms at ω, 2ω, 3ω and 4ω. This time varying power dissipation produces a corresponding temperature modulation that in turn results in resistance modulation of the conductor (the resistance of the conductor varies as the temperature varies). The voltage developed across the circuit line equals the drive current times the resistance and will contain sum and difference frequencies of each resistance term with each current term. Of particular interest are the difference frequencies corresponding to the ω term in both the resistance and the current and the 2ω term in both the resistance and the current. These yield signals at zero frequency, which is a DC voltage. This is a signal of particular interest for this invention.

The nonlinear effect of interest arises from resistance modulation which is proportional to the current squared. Since the voltage across the conductor is given by the current passing through the conductor times the resistance of the conductor, it follows that the nonlinear contribution to the voltage is proportional to the current cubed. With the current in the form of equation (6), $I^3$ can be written as:

$$I^3=t_0+t_1+t_2+t_3+t_4+t_5+t_6 \qquad (9)$$

In equation (9), each of the terms $t_0$ to $t_6$ represents a single frequency. The equations for each of the terms are:

$$t_0=-\tfrac{3}{4}I_1^2I_2 \sin(\phi) \qquad (10)$$

$$t_1=\tfrac{3}{4}\{I_1^3+2I_1I_2^2\} \sin(\omega t) \qquad (11)$$

$$t_2=\tfrac{3}{4}\{I_2^3+2I_2I_1^2\} \sin(2\omega t+\phi) \qquad (12)$$

$$t_3=\tfrac{3}{4}I_1I_2^2 \sin(3\omega t+2\phi)-(\tfrac{1}{4})I_1^3 \sin(3\omega t) \qquad (13)$$

$$t_4=-\tfrac{3}{4}I_1^2I_2 \sin(4\omega t30\ \phi) \qquad (14)$$

$$t_5=-\tfrac{3}{4}I_1I_2^2 \sin(5\omega t+2\phi) \qquad (15)$$

$$t_6=-(\tfrac{1}{4})I_2^3 \sin(6\omega t+3\phi) \qquad (16)$$

It can be seen that the term $t_0$ is at zero frequency (i.e. is DC) whenever φ is constant over time. This is an initial condition for this embodiment of the present invention. The existence of a cubic non-linearity results in the appearance of a DC voltage, even though there are no DC components of the drive current. This DC voltage component is one of the output signals of interest for the present invention. The above description includes only the basic cubic nature of the nonlinearity, and merely illustrates how the DC voltage arises from the particular choice of the drive current described in equation (6). The actual voltage depends on the details of the AC thermal response of the line. This requires an analysis of the thermal response to the power input (which is proportional to the current squared.) As in the previous discussion relating to EMTs and EBTs, this can be lumped into the functions β(ω) and θ(ω) which represent the magnitudes and phases, respectively, of the thermal response to heat input at the frequency ω. Using these functions, the following specific form is obtained for the zero frequency component of the voltage:

$$V_{dc}=\frac{\alpha I_1^2I_2R_d^2}{4}\{2\beta(\omega)\sin[\theta(\omega)-\phi]+\beta(2\omega)\sin[\theta(2\omega)-\phi]\} \qquad (17)$$

In the above, the first term arises from temperature modulation at ω and the second term is from 2ω. As in equations 3 and 5, α is the temperature coefficient of resistivity. Equation (17) can be used to express the signal from either a defect or a good-line (with $R_d$ being the resistance of the defect or line respectively). In defect screening applications, both types of signal would be present at the same time, and add. The essence of phase selectivity is that the phase shift θ(ω) differs substantially between long sections of good-lines and short defective regions. Using a section of circuit line that is known to be good, the phase, φ, can be adjusted to give zero DC voltage. In subsequent tests, if a defect is present, the phase will be different and a voltage will appear. The recognition that the relative phase of the first frequency signal 1f and the second frequency signal 2f components of the current can be used to select against good-line signals is one of the primary distinguishing features between the present disclosure and the Whitley Patent.

Carrying out the algebra, equation (10) yields the DC component. This DC signal of interest corresponds directly to the final detected AC signal in the EBT or EMT systems.

Unlike the prior art systems, however, the DC component is easily extracted from the much larger AC voltage components by means of a low pass filter. The great disparity between the drive frequencies and the signal frequency leads to very substantial advantages in overall performance.

Blocking Capacitors

Another important element in this system is the inclusion of a blocking capacitor as the final element in the drive current circuit. In both the EBT and EMT, non-linearities in the drive amplifiers result in the generation of current terms that precisely mimic the signal of interest. With the line resistances as much as 6 or 7 orders of magnitude greater than the modulation resistance, even minuscule amounts of harmonic content in the drive current cannot be tolerated. In the EMT and EBT testers, the signal frequency lies within a factor of three of the drive frequencies. Significant attenuation of the unwanted signals is impossible because it would require highly selective filters that operate at high power, and use only passive components. This is the primary limiting factor to increasing drive current levels above about 1 amp.

In the present invention, the output frequency of interest differs from the drive frequency by many orders of magnitude, allowing very effective blocking of undesired components (i.e. DC) of the drive current using simple passive elements such as capacitors. This allows much higher levels of distortion to be tolerated, thereby enabling higher drive current levels to be attained. Since the signal grows as the cube of the drive current, even a modest increase in current results in very substantial sensitivity improvements. More importantly, one can trade-off an increase in signal for a reduction in measurement time, while maintaining a constant signal to noise ratio. Since the noise scales inversely as the square root of the measurement time (for white noise), the improvement in response time scales as the sixth power of the drive current. Note that the advantages in both drive and detection circuitry become even greater as the drive frequency is raised. In principle, there is no limit to the operating frequency one can employ.

Phase Selectivity

Phase selectivity is obtained through control of the relative phase, $\phi$, in equation (6). The role of the phase can be understood by considering the thermal response of an idealized defect as compared to a good-line. In an extremely narrow and short defect, the thermal response time is very short because the heat capacity is small and the thermal resistance is low. (The bulk of the circuit line surrounding the defect acts as a thermal reservoir.) This means that the temperature modulation is nearly in-phase with the power being dissipated. Carrying out the algebra, the zero frequency component of the voltage is given by:

$$V_{dc}=-\tfrac{3}{4}\alpha I_1^2 I_2 R^2 R_{th} \sin(\phi). \quad (18)$$

Here, $\alpha$ is the temperature coefficient of resistivity, R is the electrical resistance of the defect and $R_{th}$ is the thermal resistance between the defect and the reservoir.

For an idealized good-line, the phase between the drive current and the thermal response is very slow compared to the drive frequency so the temperature responds as the time integral of the power. In the good-line case, the signal voltage is given by, $$V_{dc}=\frac{3}{8}\;\frac{1}{\omega C_{th}}\;\alpha_1^2 I_1^2 I_2 R^2 \cos(\phi), \quad (19)$$

where $C_{th}$ is the heat capacity of the line. In this idealized case $\phi$ would be set to 90° and the selectivity for defects in the presence of large good-line signals would be straightforward. In the real world, good-line signals do appear even at the "defect" phase. Like EBTs and EMTs, however, essentially perfect selectivity can be achieved empirically by adjusting the phase to obtain zero signal from known good-lines. There is some loss of sensitivity by not working at the maximum defect signal phase, but the benefits resulting from the ease of line signal rejection generally outweigh the losses. Note that the phase adjustment occurs in the drive current in this technique. The voltage signal, being DC, contains no inherent phase information of its own.

EXAMPLE

Two prototype systems were constructed for use in evaluating the present invention. Both prototype systems use a PC computer with a data acquisition board. A very useful feature of this board is the 1024 sample FIFO memory for the digital to analog converters. The board cycled continuously on this stored waveform so only a single cycle of the current waveform needed to be computed and transferred to the FIFO. The low pass filter was combined with an amplifier. The two systems differed primarily in the type of power amplifier that was used. The first used a laboratory amplifier capable of delivering peak currents in excess of one amp into loads of 50 ohms over a range of fundamental frequencies from 2 Khz to 50 Khz. This system was designed for maximum flexibility rather than low cost. The second system employed a power operational amplifier (LM675) located on the PC plug-in card which also contained the filter and amplifier. This is a low-cost version that is contained totally within the PC. The second configuration is limited in drive current and output voltage, and worked well for line resistances of 10 ohms or less at a fixed fundamental frequency of 10 Khz.

Figure 2:
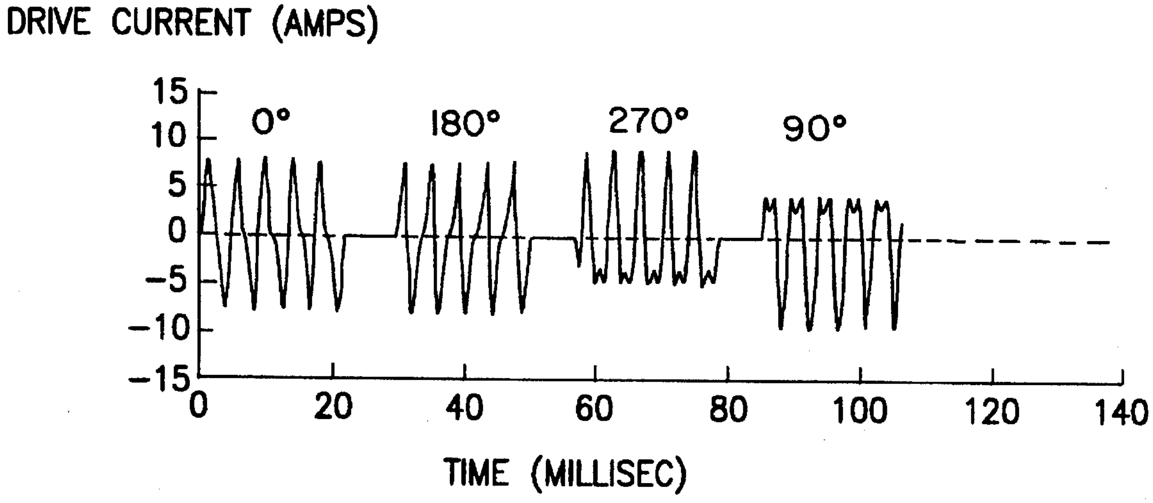
FIG. 2 illustrates a plot of a drive current vs. time plot where four bursts of different phases are transmitted over a circuit similar to FIG. 1*a* or 1*b;*
Figure 3:
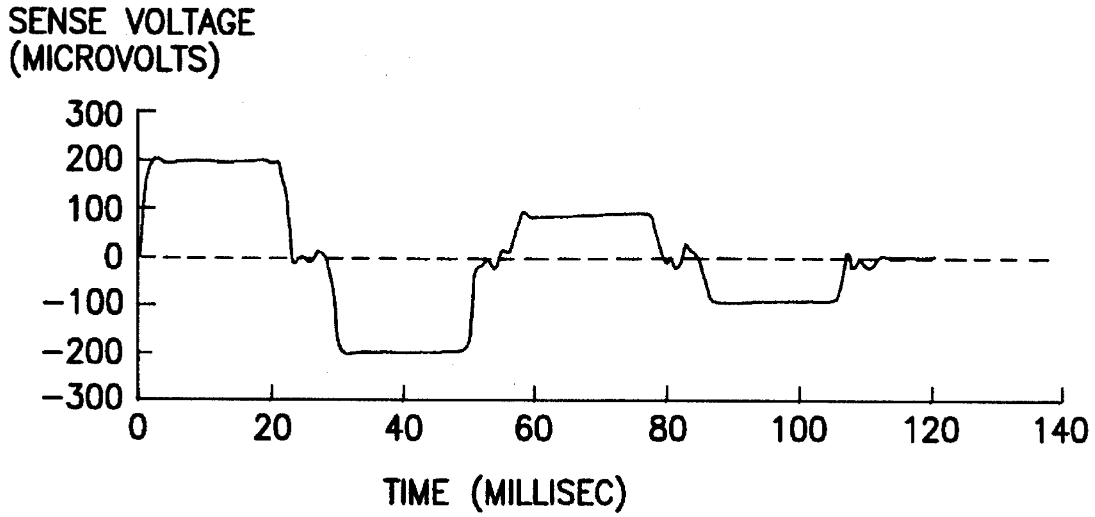
FIG. 3 illustrates a plot of the sense voltage output of the circuit of FIGS. 1*a* or 1*b*, when an input with the bursts of FIG. 2 is input.

The systems are programmed to measure both "good-line" (equation 19) and "conductors with a defect" (equation 18) phase signals. This was accomplished through the sequential application of current bursts having different relative phases, $\phi$. FIG. 2 shows an illustration of the drive current vs. time, and FIG. 3 illustrates a resultant concurrent plot of a sensed voltage waveform vs. time, for the sequence of 4 bursts that were used. This signal was obtained from a copper circuit line (10 ohms) embedded in a Teflon-line insulator on an Invar substrate. The drive current amplitudes were $I_1$=0.5 A and $I_2$=0.25 A. For the purposes of illustration, the current waveforms is shown as just a few cycles of a fairly low frequency. The actual current had a fundamental frequency of 10 KHz and each burst contained about 250 cycles. The four bursts were created at phases of 0°, 180°, 270°, and 90°. Referring to equation (19), it can be seen that bursts of two phases at 0 degrees and 180° C. produce equal but opposite signals at the idealized good-line phase (cos 0=1, and cos 180 degrees=−1.) Subtracting the voltages read by the A/D converter during these bursts yielded twice the signal and canceled out all DC drift in the amplifiers. Similarly, the 270° and 90° burst produce equal but opposite signals at the idealized defect phase of equation 18, allowing cancellation of drift for this signal as well. Another potential noise problem at relatively low frequencies was the presence of line frequency interference. The line frequency interference was highly suppressed by integrating the signal voltage over an interval of exactly one line cycle (16.667 millisec). This eliminated all harmonics of the line frequency as well. In these systems the bursts were chosen to be 24.667 millisec long to allow a settling time of 8 millisec prior to integration. The delay was required to allow recovery of the low pass filter from the transient that occurs as the blocking capacitor filters out the slight shifts in DC level at the amplifier output that occur during the bursts.

In FIG. 3 the transients appear distorted because the amplifier was switched to a low gain setting during their initial operational portion to avoid saturation. In a defect screening application, where operating speed is important, a single burst was used with a phase set at zero sensitivity for the reference good-line signal. The DC drift was accounted for by subtracting the signal level measured just prior to the burst.

The output signal in FIG. 3 was obtained for a circuit line having no defects. The presence of non-zero signals during the last 2 bursts illustrates the imperfections in the idealized model described above. Nevertheless, the models provide an absolute phase reference that can be useful. X and Y are defined as two orthogonal signal components, where X is one half the difference of the first two burst readings, and Y is one half the difference of the final two burst signals. Thus an idealized good-line has X positive and Y zero, while an idealized defect has X zero and Y positive. The magnitude of the sense voltage signal is $\sqrt{X^2+Y^2}$ and the vector phase is $\tan^{-1}(Y/X)$.

Figure 4:
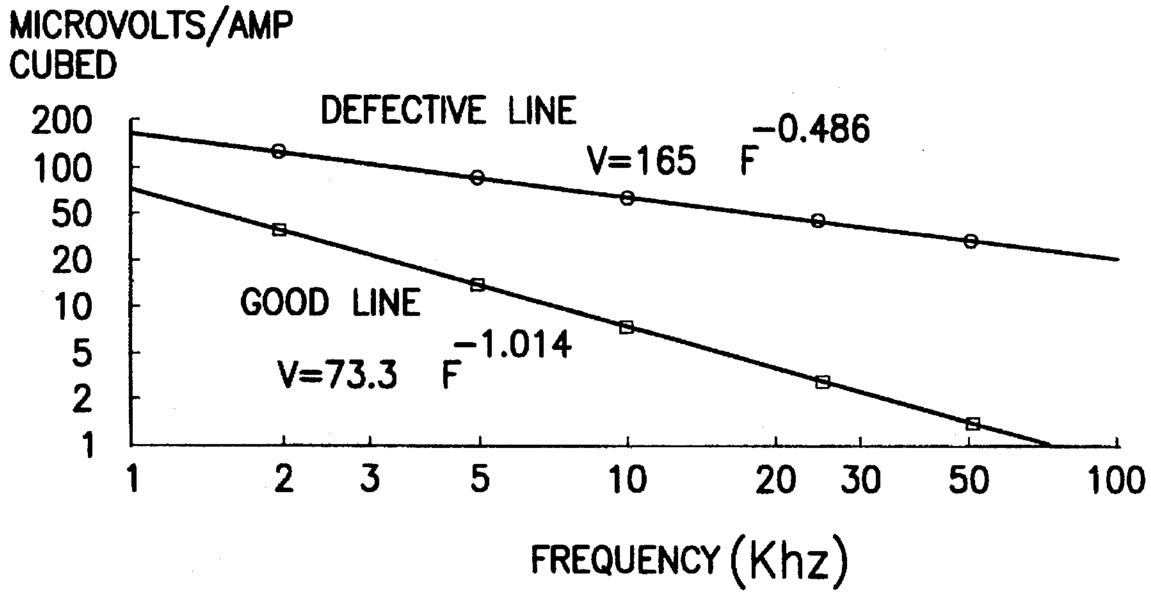
FIG. 4 illustrates a plot of printed circuit board line amplitude vs. frequency for a conductor with a defect, using the system of FIG. 1*a;*
Figure 5:
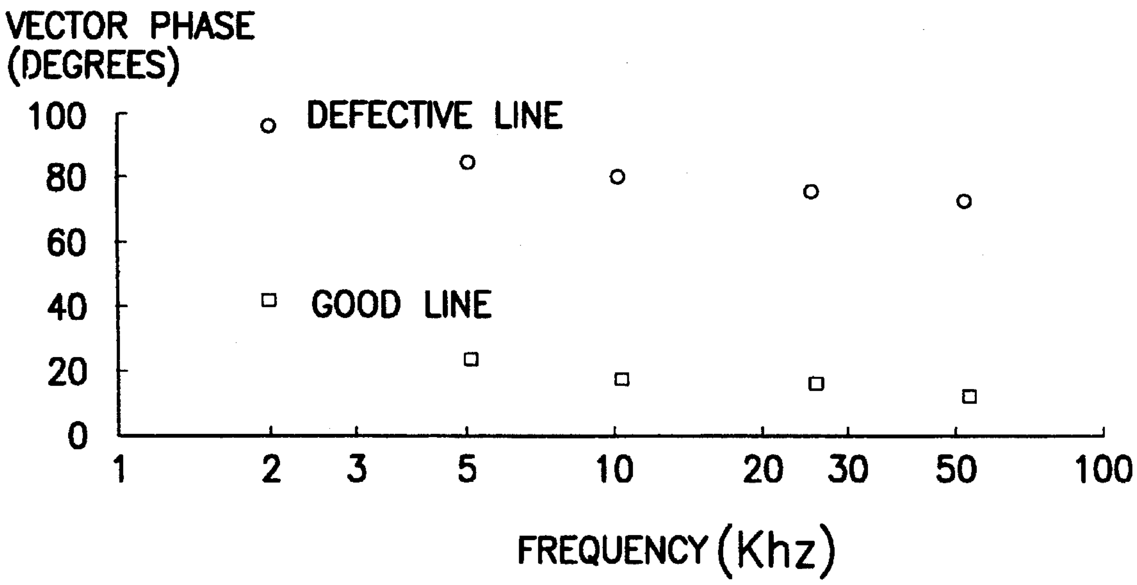
FIG. 5 illustrates a plot of printed circuit board line phase vs frequency for a conductor with a defect, using the system of FIG. 1*a;*

FIG. 4 illustrates a first plot of the magnitude versus fundamental frequency for a circuit line which contains an actual defect, and a second similar plot for a good-line of a similar length to the circuit line with an actual defect. FIG. 5 illustrates two concurrent plots of vector phase versus fundamental frequency for the above circuit line which contains an actual defect, and a good-line. According to equation (19), the idealized good-line signal falls off with an increasing frequency at the power of −1. The actual curve of FIG. 4 closely follows an equation of the −1 power.

According to equation (18), the idealized defect is expected to be constant over all frequencies. The actual observed magnitude signal for a line containing a defect does decrease with an increasing frequency as illustrated in FIG. 4. The magnitude signal includes a contribution from the defect as well as a contribution from the good-line. Thus, a portion of the total frequency curve is related to the decrease of the good-line signal with the power of −1. The vector phase results illustrate strong differences which is similar to the expected values of 90 degrees (positive Y and very small X), and the good-line results are similar to zero degrees (zero Y and positive X), especially at the higher frequencies.

The rms noise in a single shot measurement of one signal component is about 200 nanovolts for the high power system and 35 nanovolts for the low power system. In the high power system, the power amplifier contributed significantly to the total noise. The other important noise source was the Johnson noise in the resistors comprising the low-pass filter. The improved performance of the low-power system arose from a reduction in the filter resistance (from 5 KOhms to 1 KOhm) and a reduction in current amplifier noise.

The low power system is comparable in operating frequency, drive current, and load resistance range to the EBT. However, a complete 4 burst measurement took only a quarter as long as an EBT measurement and had a noise level of about 0.3 microvolts per amp cubed (at $I_1$=0.6 A and $I_2$=0.3 A), which is about one third the minimum detectable EBT signal. At line resistances of just an ohm or two the amplifier can provide currents of $I_1$=0.9 A and $I_2$=0.45 A, which yields a noise level of about 0.1 microvolts per amp cubed. In addition, the sensitivity remained constant to within a few percent over the entire range of line resistance.

The response time is affected by both the blocking capacitor and the low pass filter time constant. At higher operating frequencies, a smaller blocking capacitance can be used, and the low pass filter time constant can be smaller. In one experiment, these components were adjusted for optimum response at an operating frequency of 33 Khz. At currents of $I_1$=1.0 A and $I_2$=0.7 A, a dual burst measurement taking a total of 12 milliseconds yielded a noise level of 0.5 microvolts per amp cubed. This measurement time was comparable to that achieved using the EMT. At only 33 Khz, however, the relatively long defects that sometimes occur on printed circuit cards can still be detected.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims. In this application, the term "zero voltage" is defined as relatively small voltages, and is meant to include such voltages as may be generated by noise, etc.

What is claimed is:

1. A test apparatus for determining the presence of defects in a conductor under test comprising computer means for generating a first electrical signal $I_1$ having a first frequency and a first phase and a second electrical signal $I_2$ having a second frequency and a second phase wherein said second frequency is twice said first frequency, at least one electrical circuit path including a resistor and a capacitor connected in series to said computer means, an electrical conductor under test connected to said at least one electrical circuit path at a node, said electrical conductor under test having a resistance producing a DC voltage, and phase sensitive measuring circuit means connected between said node and said computer means to detect a DC voltage across said electrical conductor to provide a phase signal to said computer to indicate a defect of said electrical conductor under test.

2. The apparatus as described in claim 1, wherein said first electrical signal $I_1$ and second electrical signal $I_2$ are applied as a plurality of current bursts.

3. The apparatus as described in claim 2, wherein said first phase is $\phi$ degrees and said second phase is $\phi$+90 degrees and wherein said plurality of current bursts are used to obtain two readings X and Y, representative of phases $\phi$, and $\phi$+90 degrees, respectively.

4. The apparatus as described in claim 3, wherein the two readings, X and Y, are used to compute a third reading, Z, representative of a phase $\phi'$ utilizing the equation:

$$Z=Y \sin(\phi'-\phi)-X \cos(\phi'-\phi)$$

5. The apparatus as described in claim 4, wherein said reading Z is a defect component of the conductor signal.

6. The apparatus as described in claim 5, wherein said capacitor in said at least one circuit path functions to limit the passage of a DC signal.

7. A test apparatus according to claim 1 wherein a first electrical circuit path is connected to said computer means for conducting said first electrical signal $I_1$ and a second electrical circuit path is connected to said computer means for conducting said second electrical signal $I_2$, and wherein said node is connected to said first and second electrical circuit paths and to said electrical conductor under test.

8. An apparatus for detecting defects in a conductor, comprising:

a computer providing a computer signal; and first and second paths communicating said computer signal to a conductor, the first path comprises at least a first D/A converter, wherein said second path comprises at least a second D/A converter, wherein the first D/A converter is capable of producing a first frequency signal and said second D/A converter is capable of producing a second frequency signal;

first capacitor connected in said first path for adjusting a phase of the first frequency signal and second capacitor connected in said second path for adjusting a phase of the second frequency signal as applied to the conductor; and a low-pass filter and an A/D converter means connected between said computer and said first and second paths and said conductor for detecting defects in said conductor based upon a DC output from said conductor.

9. The apparatus as described in claim 8, wherein each path further comprises:

an amplifier connected to each D/A converter.

10. The apparatus as described in claim 8, wherein said conductor has an electrical resistance and wherein each path further comprises:

series resistors which have large resistances compared to the resistance of the conductor associated with each D/A converter.

11. The apparatus as described in claim 9, wherein said first capacitor and said second capacitor respectively located in said first path and said second path function to limit the passage of a DC signal from said amplifier while permitting passage of an AC signal.

* * * * *